United States Patent
Gillot et al.

(10) Patent No.: US 9,653,636 B2
(45) Date of Patent: May 16, 2017

(54) DEVICE FOR INTERCONNECTING PHOTOVOLTAIC CELLS HAVING CONTACTS ON THEIR BACK SIDE, AND MODULE COMPRISING SUCH A DEVICE

(71) Applicant: Commissariat à L'Energie Atomique et aux Energies Alternatives, Paris (FR)

(72) Inventors: Charlotte Gillot, Saint-Egreve (FR); Stéphane Guillerez, Le Pin le Lac (FR); Philippe Voarino, Nice (FR)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 0 days.

(21) Appl. No.: 14/652,626

(22) PCT Filed: Dec. 18, 2013

(86) PCT No.: PCT/EP2013/077077
§ 371 (c)(1),
(2) Date: Jun. 16, 2015

(87) PCT Pub. No.: WO2014/095991
PCT Pub. Date: Jun. 26, 2014

(65) Prior Publication Data
US 2015/0340529 A1 Nov. 26, 2015

(30) Foreign Application Priority Data
Dec. 18, 2012 (FR) ..................................... 12 62258

(51) Int. Cl.
*H01L 31/00* (2006.01)
*H01L 31/05* (2014.01)
(Continued)

(52) U.S. Cl.
CPC ........ *H01L 31/0512* (2013.01); *B23K 1/0016* (2013.01); *B32B 37/12* (2013.01);
(Continued)

(58) Field of Classification Search
CPC ........................ H01L 31/0508; H01L 31/0516
See application file for complete search history.

(56) References Cited

U.S. PATENT DOCUMENTS 3,255,047 A * 6/1966 Escoffery .............. H01L 31/042
136/244
5,972,732 A 10/1999 Gee et al.
(Continued)

FOREIGN PATENT DOCUMENTS

EP 1369930 A1 12/2003
EP 2660878 A1 11/2013
(Continued)

OTHER PUBLICATIONS

International Search Report for Application No. PCT/EP2013/077077 dated Feb. 7, 2014.

*Primary Examiner* — Eli Mekhlin
(74) *Attorney, Agent, or Firm* — Lerner, David, Littenberg, Krumholz & Mentlik, LLP

(57) ABSTRACT

The invention relates to a device for interconnecting photovoltaic cells having contacts on their back side, comprising at least one layer of a woven produced from electrically insulating fibers, comprising at least one thread or tape section made of an electrically conductive material woven with said fibers and arranged so as to be flush with the surface of at least one region of the woven in order to form an electrical contact region intended to be connected to a contact pad located on the back side of a cell. The invention also relates to a module of interconnected photovoltaic cells having contacts on the back side, comprising an intercon-
(Continued)

necting device arranged along the back side of the cells, and a process for manufacturing such a module.

18 Claims, 5 Drawing Sheets

(51) Int. Cl.
    *H01L 31/048*    (2014.01)
    *H01L 31/0224*   (2006.01)
    *H01L 31/18*     (2006.01)
    *B23K 1/00*     (2006.01)
    *B32B 37/18*    (2006.01)
    *B32B 37/12*    (2006.01)

(52) U.S. Cl.
    CPC ...... *B32B 37/18* (2013.01); *H01L 31/022441* (2013.01); *H01L 31/048* (2013.01); *H01L 31/0508* (2013.01); *H01L 31/0516* (2013.01); *H01L 31/18* (2013.01); *B32B 2307/202* (2013.01); *B32B 2457/12* (2013.01); *Y02E 10/50* (2013.01); *Y10T 156/10* (2015.01)

(56) References Cited

U.S. PATENT DOCUMENTS

| | | | |
|---|---|---|---|
| 2004/0191422 A1* | 9/2004 | Kataoka | H01L 31/048 427/553 |
| 2004/0244193 A1 | 12/2004 | Jung et al. | |
| 2010/0031997 A1* | 2/2010 | Basol | H01L 31/048 136/244 |
| 2010/0089434 A1* | 4/2010 | Fishman | H01L 31/048 136/246 |
| 2011/0067751 A1 | 3/2011 | Meakin et al. | |
| 2011/0126878 A1 | 6/2011 | Hacke et al. | |
| 2012/0167959 A1 | 7/2012 | Wirth et al. | |

FOREIGN PATENT DOCUMENTS

| | | |
|---|---|---|
| WO | 2012059534 A2 | 5/2012 |
| WO | 2012173487 A1 | 12/2012 |

* cited by examiner

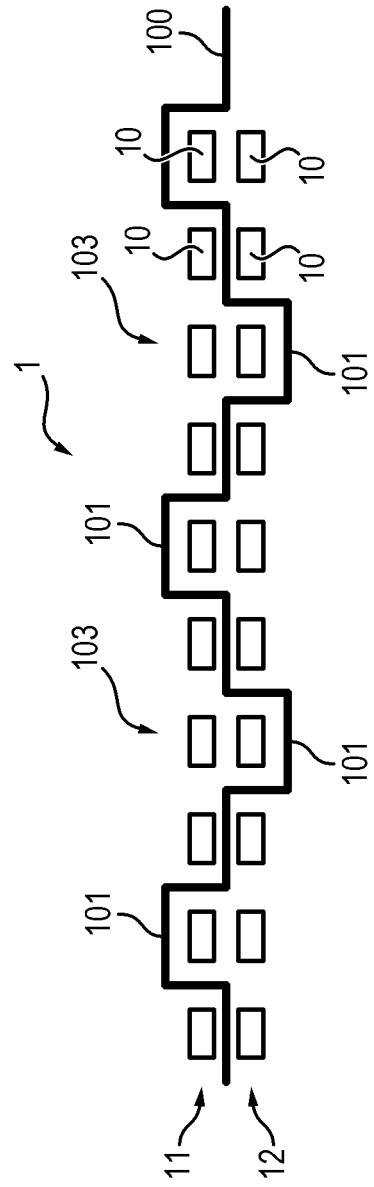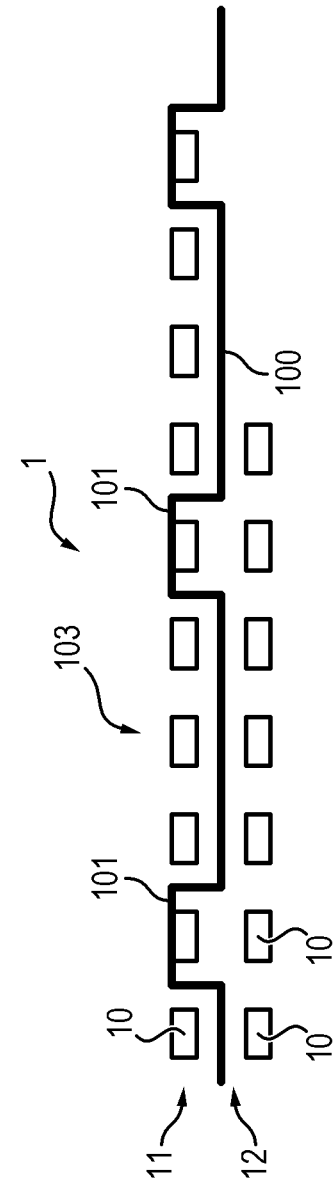

DEVICE FOR INTERCONNECTING PHOTOVOLTAIC CELLS HAVING CONTACTS ON THEIR BACK SIDE, AND MODULE COMPRISING SUCH A DEVICE

CROSS REFERENCE TO RELATED APPLICATIONS

This application is a national phase entry under 35 U.S.C. §371 of International Application No. PCT/EP2013/077077, filed Dec. 18, 2013, published in French, which claims the benefit of the filing date of French Patent Application No. 1262258, filed Dec. 18, 2012, the disclosures of which are hereby incorporated herein by reference.

FIELD OF THE INVENTION

The present invention concerns a device for interconnecting photovoltaic cells having back side contacts, allowing the modular assembly of said cells, a module of photovoltaic cells having back side contacts comprising such a device, and a process for manufacturing such a module.

BACKGROUND OF THE INVENTION

Photovoltaic cells having back side contacts are a particular type of cell having their two metal electrodes on the back side i.e. their side opposite the side which receives solar radiation.

Electrical connection pads are formed on each of said electrodes respectively for their connection to an electric circuit allowing collection of the photogenerated current.

This configuration of the cells is particularly advantageous for producing a module comprising a plurality of such cells.

It effectively simplifies assembly—all the interconnections being made on the same side—and increases the production yields of the modules.

In addition, it allows the cells to be brought closer to one another, the effect of which is a significant increase in the electric performance of the module.

At the current time, two interconnection modes of cells with back side contacts are chiefly employed.

One first possibility, as for standard photovoltaic cells, is to use copper ribbons soldered onto the pads of each of the back side metal electrodes respectively. Alternatively, metal connectors can be used.

Document U.S. 2011/0126878 proposes interconnecting the cells using copper ribbons previously shaped to reduce thermal mechanical stresses due to the difference in the thermal expansion coefficient between the material of the cells (generally silicon) and the copper.

One second possibility for cells known as MWT cells (Metal Wrap Through) or EWT cells (Emitter Wrap Through) is to solder or glue the cells onto a metallised film.

In general it is the protective backsheet, the chief functions of which are to ensure electric insulation and to protect the module against outside attack, which meets this additional support-giving role, a copper layer comprising the metal interconnect lines being arranged on the side of the protective backsheet in contact with the connection pads on the back side of the cells.

In this respect reference can be made to U.S. 2011/0067751 which describes such a locally metallised, protective backsheet.

One disadvantage of this technique is the high cost of such a metallised film, which is produced using processes similar to those used to form printed circuits.

In addition, this technique entails a significant loss of material since the formation of the conductive traces generally assumes that the metallised film is deposited on the entire side of the protective backsheet followed by chemical etching so as to maintain only those regions intended to form the traces.

Document U.S. Pat. No. 5,972,732 describes several variants of this technique.

According to one embodiment, the conductive traces are formed on a substrate in the form of a mesh in polymer material, said mesh being inserted between the protective backsheet and the cells. The assembly is then laminated with an encapsulating material which passes through the mesh openings to ensure the mechanical strength of the module.

In all cases these techniques have the drawback of requiring the positioning of an electrically insulating layer between the cells and the connectors or metal traces to prevent short-circuiting.

Said electrically insulating layer may be present on each cell, on the connector or on the metallised film.

Alternatively said insulating layer may be an independent layer inserted between each cell and the connector or metallised film.

Document WO 2012/059534 describes a particular example of such an electrically insulating layer, in the form of a glass fibre fabric. Said layer is placed between the cells and the connectors, the electrical connection being obtained through the fabric. This requires that the mesh openings of said fabric should be sized so that when the cells are connected to the connectors by soldering the molten fusible alloy is able to pass through the fabric.

Irrespective of the form of this insulating layer, the positioning thereof entails an additional step in the fabrication of the module.

It is therefore one objective of the invention to design means for interconnecting photovoltaic cells having back side contacts which overcome the aforementioned disadvantages.

In particular, it must be possible to obtain the interconnecting of the cells by applying a minimum number of steps and using the least possible number of separate components.

BRIEF DESCRIPTION OF THE INVENTION

According to the invention, there is proposed a device for interconnecting photovoltaic cells having back side contacts, characterized in that it comprises at least one layer of fabric having electrically insulating fibres, said fabric comprising at least one portion of wire or ribbon in electrically conductive material woven with said fibres and arranged to as to lie flush with the surface of at least one region of the fabric to form an electrical contact area intended to be connected to a contact pad positioned on the back side of a cell.

Said at least one portion of electrically conductive wire or ribbon may lie parallel to the weft fibres of said fabric or to the warp fibres of said fabric.

According to one embodiment, said portion of electrically conductive wire is formed of a plurality of strands.

Advantageously the porosity of said fabric is selected so as to allow the impregnation of the photovoltaic cells with an encapsulating material during a lamination step of the cells and of said device.

According to one embodiment of the invention, said fabric is a three-dimensional fabric comprising at least two layers of electrically insulating fibres, said layers being joined to one another by a plurality of electrically insulating fibres.

For example, the electrically insulating fibres of said fabric may be glass fibres or textile fibres.

Said fabric advantageously has a mass per unit area of between 10 and 100 g/cm$^2$.

According to one embodiment, said portion of electrically conductive wire or ribbon is arranged so as to lie flush with the surface of a region of a first side of the fabric of electrically insulating fibres, and with the surface of a region of a second side of the fabric opposite the first side so as to form electrical contact areas on two sides of said interconnection device.

The fabric may advantageously contain fibres in a material for encapsulating the photovoltaic cells, said material being adapted to impregnate the fabric and encapsulate the photovoltaic cells during a lamination step of the cells and of said device.

A further subject of the invention is a module of photovoltaic cells having interconnected back side contacts comprising a plurality of back contact photovoltaic cells and an interconnection device such as described above arranged along the back side of the cells, the arrangement of the electrical contact areas on the surface of the fabric of electrically insulating fibres of said device being selected so that the contact pads of the cells are joined to the contact areas of said device and so that said contact pads are electrically insulated from one another by a region of the fabric layer of electrically insulating fibres positioned between said pads.

According to one embodiment of said module, the interconnection device ensures the electrical connection of at least one contact pad of a cell with a contact pad having opposite polarity of an adjacent cell via one same electrical contact area or via two separate electrical contact areas, said areas being electrically connected by a ribbon arranged transverse to said areas.

In addition said module, between the back side of said cells and the interconnection device, may comprise a least one layer of fabric formed of electrically insulating fibres.

Also, the cells and the interconnection device can be encapsulated in an encapsulation material, said material impregnating the fabric of the interconnection device.

Finally, a further subject of the invention concerns a process for manufacturing a module comprising a plurality of photovoltaic cells having interconnected back side contacts, which comprises:
  providing an interconnection device such as described above;
  matching each of the contact pads of each of said cells with the electrical contact areas of said device, said contact pads being insulated from one another by a portion of the layer of fabric of electrically insulating fibres positioned between said pads;
  forming an electrical connection between the pads and said electrical contact areas.

The electrical connection of the pads with the electrical contact areas is obtained by soldering.

Alternatively, the electrical connection of the pads with the electrical contact areas is obtained by gluing using a conductive adhesive.

Said process may further comprise a lamination step of the device connected to the cells using an encapsulating material, said material impregnating the meshing of the fabric.

According to one embodiment, said process comprises the insertion of an electrically insulating fabric between the interconnection device and the back side of the photovoltaic cells before forming the electrical connection between the pads and the electrical contact areas, then forming said electrical connection by applying an electrical conductive material, said material being capable of passing through said fabric.

The provision of the interconnection device advantageously comprises the weaving of the electrically insulating fibres with said at least one portion of electrically conductive wire or ribbon to form the fabric.

BRIEF DESCRIPTION OF THE DRAWINGS

Other characteristics and advantages of the invention will become apparent from the following detailed description with reference to the appended drawings wherein:

FIGS. 3A and 3B illustrate two embodiments of the interconnection device in which the fabric of electrically insulating fibres is a three-dimensional fabric;

DETAILED DESCRIPTION OF THE INVENTION

Figure 1:
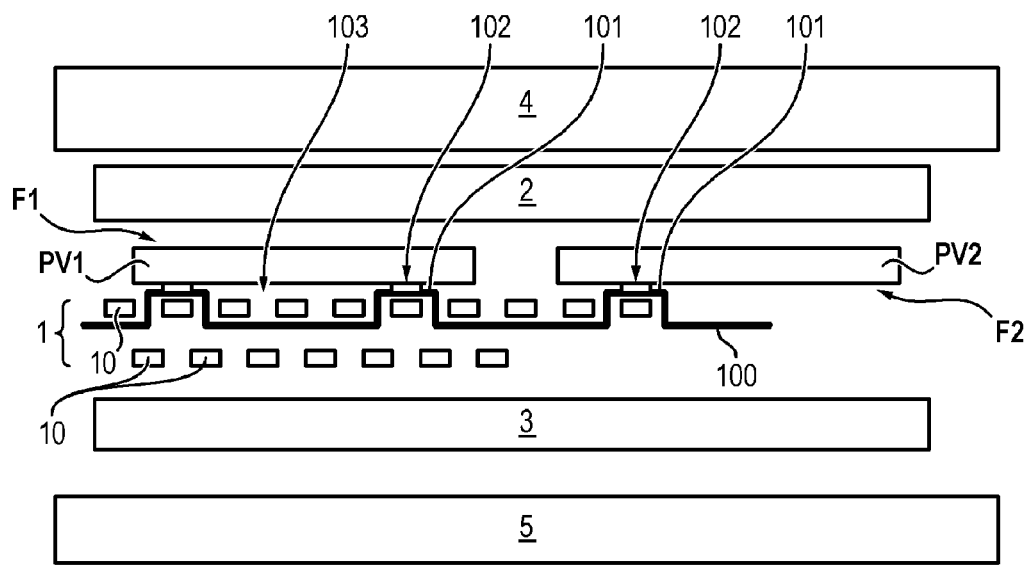
FIG. 1 is a cross-sectional view, before lamination, of the components of a module according to one embodiment of the invention.

FIG. 1 is a cross-sectional view of the components needed to produce a module comprising interconnected photovoltaic cells, before the lamination step.

This Figure illustrates two cells PV1, PV2 with back side contacts, arranged side-by-side to form a module. The front side of the cells is designated F1; the back side which carries the contact pads is designated F2.

Evidently, the module may comprise a larger number of photovoltaic cells which can be arranged for example in rows and columns.

An interconnection device 1 is arranged along the back sides of the cells PV1, PV2.

As is explained in detail below, said device 1 comprises a fabric of electrically insulating fibres 10.

In FIG. 1 only the warp fibres are illustrated (in cross-section) but the fabric also comprises weft fibres perpendicular to the warp fibres.

In addition, the device 1 comprises at least one portion 100 of electrically conductive wire or ribbon arranged among the fibres of the fabric and lying flush with one side of the fabric (called the front side) so as to form an electrical contact area 101.

By "among" is meant that the portion 100 of wire or ribbon is woven at the same time as the electrically insulating fibres following the same weave as said fabric.

It is this weaving which ensures the mechanical strength of the conductive regions on the fabric before lamination.

Since the area 101 is positioned opposite an interconnection pad located on the back side of a photovoltaic cell, it can be electrically connected (reference 102) thereto by any known means such as soldering, conductive glue, etc.

This device has the advantage of providing an electrical connection via contact between the electrical contact area and the contact pad. It is therefore not necessary to size the fabric of fibres with a view to passing interconnecting material whether this be a fusible alloy for soldering or a glue.

Advantageously, to obtain the interconnection between two cells PV1, PV2, said portion 100 of electrically conductive wire or ribbon is arranged so as to lie flush with two front regions of the fabric, to form two electrical contact areas 101 facing two contact pads of each of the two cells.

It is therefore possible to place in contact the positive poles of one cell with the negative poles of an adjacent cell.

Optionally, the electrical contact areas formed by positioning the electrically conductive portion of wire or ribbon flush with the surface of the fabric may be located on two opposite sides of the fabric.

The conductive regions of the fabric arranged on the opposite side to the cell side are intended to allow contact with one or more ribbons via which external electrical connections can be made.

By "portion of wire or ribbon" is meant the fact that the electrically conductive wire or ribbon does not extend over the entire length or width of the interconnection device 1, but over a portion thereof sufficient to interconnect two adjacent photovoltaic cells.

In other words, the portion of wire or ribbon is shorter in length than the warp and/or weft threads.

When the module comprises a plurality of aligned cells, the interconnection device may therefore comprise several separate portions of wire or ribbon extending over one same line but not electrically connected together.

Also, between two electrical contact areas 101, the interconnection device has electrically insulating regions 103 which allow the electrical contact areas 101 to be insulated from regions of the cell other than the contact pads.

The portion of wire or ribbon is arranged in relation to the fibres of the fabric such that, between two electrical contact areas, the wire or ribbon passes underneath the fibres of the fabric: these regions of the device are therefore electrically insulating due to the presence of the fibres on the surface.

Optionally, it is possible to manufacture the fabric with fibres of different diameters to adjust the conductive regions and insulating regions. For example, the insulating regions 103 can be produced with larger fibres to obtain better overlapping of the underlying conductive portion of wire or ribbon.

On either side of the assembly formed by the interconnected cells PV1, PV2 and the interconnection device 1, two layers 2, 3 of encapsulating material are illustrated.

The front side of the module (intended to receive solar radiation) is covered with a glass sheet 4 intended to protect the front side of the cells.

The back side of the module is coated with a protective sheet 5 called a "backsheet".

During the manufacture of the module the electrical contact areas 101 of the device 1 are connected to the contact pads of the cells PV1, PV2.

Connection can be obtained using any type of conventional method such as soldering or gluing.

The different components of the module are then superimposed and module assembly can be carried out.

The module assembly may comprise, for example, a lamination step during which the encapsulation material(s) previously added to the different components of the module become viscous, impregnate the fabric due to the porosity thereof and encapsulate the different cells.

Other module assembly techniques exist which do not use an encapsulating material.

Module assembly techniques other than lamination also exist.

The invention is therefore not limited to any particular module assembly technique.

Compared with existing interconnection devices the above-described device has the advantage of being low-cost and not causing loss of material.

Additionally, the same device ensures both the electrical connection of cells (via the electrical contact areas 101) and the electrical insulation of the pads (via the electrically insulating regions 103).

Finally, the fact that the portion of electrically conductive wire or ribbon is not planar allows thermal mechanical stresses at the cell connections to be reduced.

Figure 2:
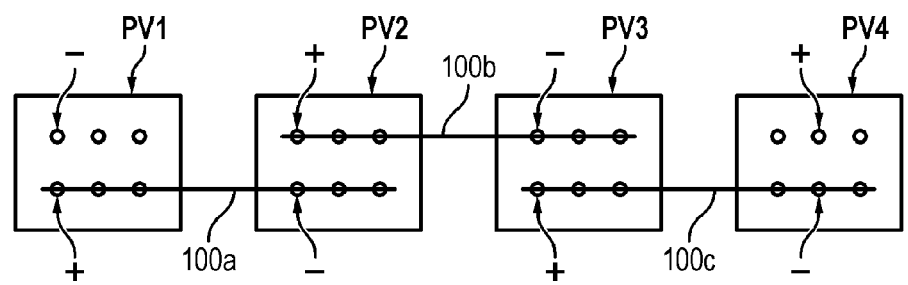
FIG. 2 schematically illustrates an example of the interconnecting of cells having back side contacts.

FIG. 2 gives an underside view of the interconnecting principle of the + and − poles of four cells PV1 to PV4 of a module.

In this example, each cell is schematised in the form of a rectangle with three aligned positive pads and three aligned negative pads.

The + contact pads of cell PV1 are electrically connected to the − contact pads of the adjacent cell PV2 via a first portion 100a of electrically conductive wire or ribbon.

The + contact pads of cell PV2 are electrically connected to the − contact pads of the adjacent cell PV3 via a second portion 100b of electrically conductive wire or ribbon.

The + contact pads of cell PV3 are electrically connected to the − contact pads of the adjacent cell PV4 via a third portion 100c of electrically conductive wire or ribbon.

Although the portions 100a and 100c are aligned, they do not belong to a continuous wire or ribbon and are therefore not electrically connected.

The arrangement of the portions of electrically conductive wire or ribbon in the fabric of insulating fibres, and of the regions in which these portions lie flush with the surface of the fabric, is defined as a function of the electrical wiring layout of the cells within the module.

The insertion of the portions of electrically conductive wire or ribbon is performed during weaving of the fabric.

In particular, it can be performed by replacing an electrically insulating fibre intended to form the fabric by a continuous electrically conductive wire which is then cut into portion(s) along the desired plane of interconnection.

It is within the reach of the person skilled in the art to position the different portions of electrically conductive wire or ribbon at the desired points for the interconnection regions.

Preferably, the fabric of electrically insulating fibres has a satin-type or twill-type weave rather than a plain weave.

In opposition to a plain weave wherein a weft fibre successively passes above and below warp fibres, thereby forming a chequer pattern, satin- or twill-type weaves have a broad diversity of patterns and allow better adaptation to the stresses of wiring providing greater freedom for arrangement of the portions of electrically conductive wire or ribbon.

The definition of these types of weaves is known per se and will therefore not be described in detail herein.

The electrically insulating fibres of the fabric are advantageously glass fibres or textile fibres such as those in polyamide for example.

The fabric typically has a mass per unit area of between 10 and 100 g/cm$^2$.

Also, the fabric advantageously has sufficient porosity to allow impregnation of the photovoltaic cells by the encapsulating material(s) at an optional lamination step performed during modular assembly.

Therefore the encapsulating material, which is generally a thermoplastic polymer or elastomer such as EVA for example, becomes viscous under the effect of heating applied during lamination and is able to pass through the openings of the fabric for impregnation thereof.

The fabric does not therefore prevent homogenous distribution of the encapsulating material throughout the module.

According to one particular embodiment, the fabric of electrically insulating fibres can be impregnated with material allowing some dimensional stability to be imparted thereto.

Also said fabric may comprise fibres in encapsulating material (e.g. a thermoplastic) intended to melt during the lamination step.

According to one embodiment of the invention illustrated in FIGS. 3A and 3B, the fabric may be a so-called "3D" fabric (three-dimensional) comprising at least two layers 11, 12 of electrically insulating fibres 10, said layers 11, 12 being joined to one another via a plurality of electrically insulating fibres (not illustrated).

The fibres forming each of the layers may be the same or different.

It is thus possible to intercalate a portion 100 of electrically conductive wire or ribbon at different thicknesses of the fabric (between different layers).

In particular, this allows the wire or ribbon in some regions to be caused to lie flush with the surface of one and/or the other of the two sides of the fabric, and in other regions to leave the wire or ribbon in the thickness of the fabric to form electrically insulating regions. Also in these latter regions the layers of fibres located either side of the wire or ribbon further ensure mechanical support, this being all the more useful if there is a long distance between two electrical contact areas formed by the same portion and if the portion of wire or ribbon is rectilinear as illustrated in FIG. 3B.

As set forth above, the electrical contact areas 101 can be formed by a portion of electrically conductive wire or ribbon e.g. in copper, silver or a copper or silver alloy.

The surface area of each electrical contact area intended to be connected to a contact pad is preferably between 1 and 7 mm$^2$.

The cross-section of the wire or ribbon is typically between 0.1 and 0.5 mm$^2$.

For example, it is possible to use copper ribbon having a width of 2 mm and thickness of 0.1 mm.

If a wire is used, this may be formed of a single strand or a plurality of parallel strands arranged sufficiently close to one another so that they can be connected to one same pad of a cell. In this latter case, said strands may optionally be separated from each other by one or more electrically insulating fibres.

The advantage of a plurality of strands compared with a ribbon of equivalent cross-section is that it allows a more flexible conductive portion to be obtained, which reduces applied thermal mechanical stresses at the time of weaving and module assembly.

Figure 4:
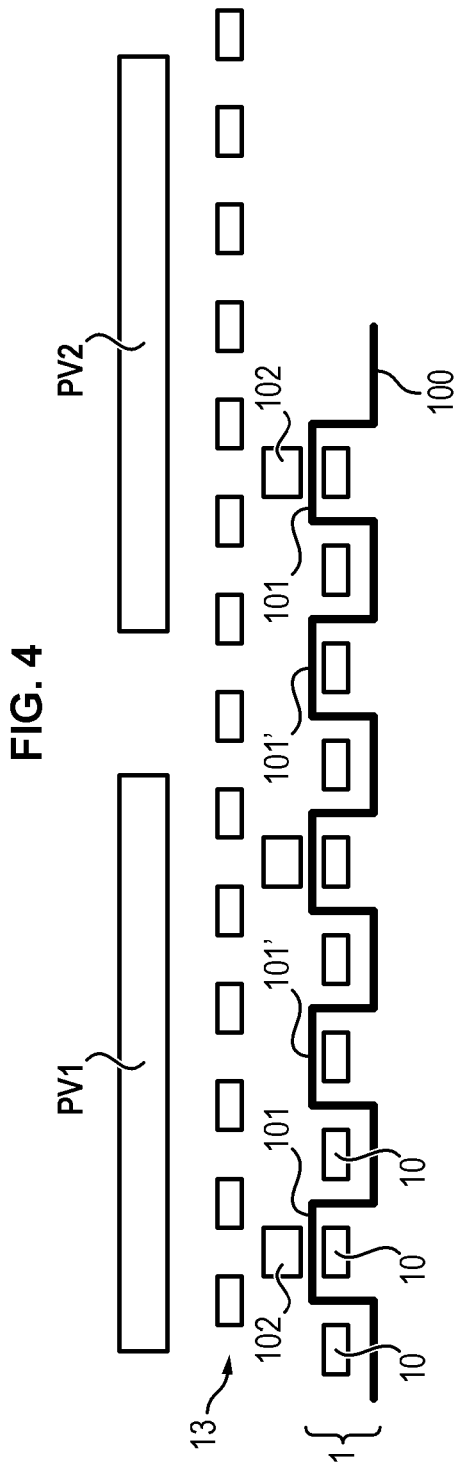
FIG. 4 illustrates one embodiment of a module wherein an electrically insulating layer is intercalated between the back side of the cells and the interconnection device.

According to one embodiment illustrated in FIG. 4, it is possible to intercalate an electrically insulating porous layer 13 (e.g. a glass fibre fabric) between the back side of the cells and the interconnection device.

This layer 13 allows reinforced insulation of the contact pads of the different cells.

Said layer is of particular interest when the interconnection device comprises regions 101' in which a portion 100 of electrically conductive wire or ribbon lies flush with the surface of the fabric but these regions are not intended to be connected to the contact pads of the cells. These regions 101' are therefore functionally different from the electrical contact areas 101.

In this case, the electrically insulating layer 13 prevents any undue electrical connection between the regions 101' of the interconnection device and the contact pads of the cells.

However, it is necessary to select the porosity of said layer 13 to allow the passing of the interconnection material (solder alloy or glue) intended to connect the electrical contact areas 101 electrically to the corresponding contact pads.

Said layer 13 can be formed of the same electrically insulating fabric as the interconnection device (without any conductive wire or ribbon in this case) or else a different fabric.

As seen in the foregoing, the interconnection device ensures the electrical connection between at least one contact pad of a cell and a contact pad of opposite polarity of an adjacent cell.

According to one embodiment, said connection is obtained by one same electrical area which is arranged along said pads.

According to one alternative embodiment, said connection is formed of two separate electrical contact areas, said areas being electrically connected together by a portion of ribbon arranged transverse to said areas.

Figure 5:
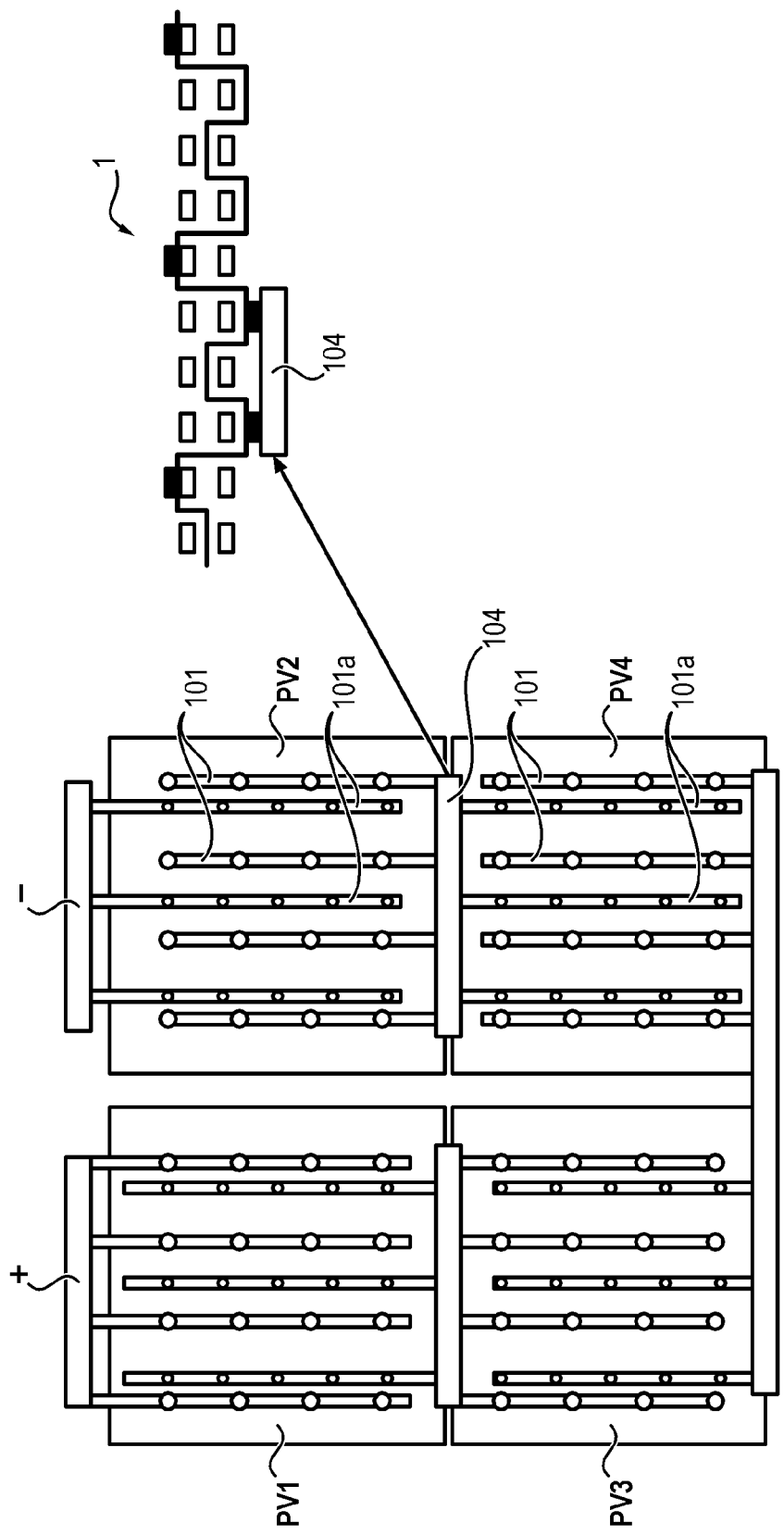
FIGS. 5 and 6 illustrate examples of modules according to the invention.
Figure 6:
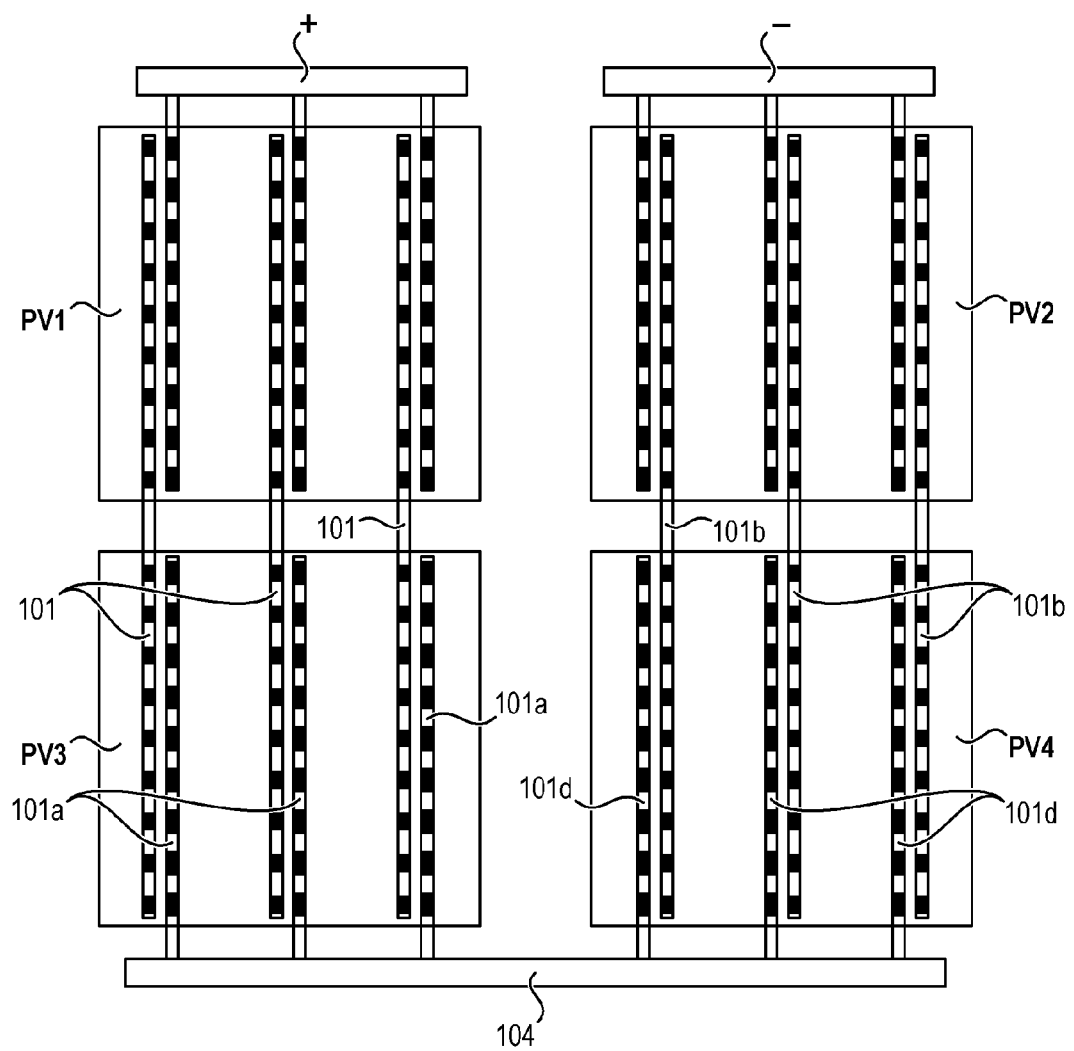

FIGS. 5 and 6 illustrate two examples of embodiment of the invention.

FIG. 5 schematically illustrates a module of 2×2 photovoltaic cells PV1 to PV4 with back side contacts.

Each cell has four contact pads connected to a + output and three contact pads connected to a − output.

The + pads of cell PV2 are connected to the − pads of cell PV4 by two series of conductive wires 101, 101a, said portions being electrically connected by a ribbon 104 arranged transverse to said portions.

As illustrated on the right in the figure, the portion of ribbon 104 can be soldered to each of said wire portions 101, 101a, on the side opposite the cells of the interconnection device 1.

Alternatively, the portion of ribbon can be integrated in a three-dimensional fabric between two layers of said fabric.

FIG. 6 schematically illustrates another module of 2×2 photovoltaic cells PV1 to PV4 with back side contacts.

Each cell has three contact pads connected to a + output and three contact pads connected to a − output.

In the interconnection device, in which only the portions of wire or ribbon forming electrical contact areas are illustrated, three wire portions 101 connect the − contact pads of cell PV1 to the + contact pads of cell PV3.

Similarly, the + contact pads of cell PV2 are connected to the − contact pads of cell PV4 via three wire portions 101b.

The − contact pads of cell PV3 are connected to the + contact poles of cell PV4 via two separate wire portions 101a, 101d that are connected by a portion of ribbon 104 which extends transverse to said portions 101a, 101d.

In the particular embodiment of an Interdigitated Back Contact structure (IBC) the electrodes are formed on the back side by interdigitated fingers.

A dot of glue or solder point is then formed on the electrical contact areas of the fabric and/or at the electrodes along the interconnection plane.

Finally, the examples given in the foregoing are evidently only particular illustrations and in no way limit the fields of application of the invention.

In particular, as mentioned above, the interconnection device is custom produced as a function of the module to be assembled, particularly taking into account the number and type of cells and the interconnection plane of said cells.

REFERENCES

U.S. 2011/0126878
U.S. 2011/0067751
U.S. Pat. No. 5,972,732
WO 2012/059534

The invention claimed is:

1. A device for interconnecting photovoltaic cells having back side contacts, comprising a three-dimensional fabric including at least two fabric layers of electrically insulating fibres joined together by a plurality of electrically insulating fibres, wherein at least one layer of electrically insulating fibres comprises at least one portion of wire or ribbon in electrically conductive material woven with said fibres and arranged so as to lie flush with a surface of at least one region of the fabric to form an electrical contact area intended to be connected to a contact pad located on a back side of a cell, another portion of said wire or ribbon in electrically conductive material being intercalated between the at least two fabric layers of insulating fibres.

2. The device of claim 1, wherein the fabric comprises weft fibres and warp fibres, said at least one portion of electrically conductive wire or ribbon lies parallel to the weft fibres of the fabric.

3. The device of claim 1, wherein the fabric comprises weft fibres and warp fibres, said at least one portion of electrically conductive wire or ribbon lies parallel to the warp fibres of the fabric.

4. The device of claim 1, wherein when the fabric comprises at least one portion of wire in electrically conductive material, said portion of electrically conductive wire is formed of a plurality of strands.

5. The device of claim 1, wherein the fabric has a porosity selected so as to allow impregnation of the photovoltaic cells with an encapsulating material at a lamination step of the cells and of said device.

6. The device of claim 1, wherein the electrically insulating fibres of the fabric are glass fibres or textile fibres.

7. The device of claim 1, wherein the fabric has a mass per unit area of between 10 and 100 g/cm2.

8. The device of claim 1, wherein said portion of electrically conductive wire or ribbon is arranged so as to lie flush with a surface of a region of a first side of the fabric of electrically insulating fibres and with a surface of a region of a second side of the fabric opposite the first side so as to form electrical contact areas on two sides of said interconnection device.

9. The device of claim 1, wherein the fabric contains fibres that are impregnated with a material, said material being adapted to encapsulate the photovoltaic cells at a lamination step of the cells and of said device.

10. A module of photovoltaic cells with interconnected back side contacts, comprising a plurality of photovoltaic cells with back side contacts and an interconnection device arranged along a back side of the cells, wherein the interconnection device comprises a three-dimensional fabric including at least two fabric layers of electrically insulating fibres joined together by a plurality of electrically insulating fibres, wherein at least one layer of electrically insulating fibres comprises at least one portion of wire or ribbon in electrically conductive material woven with said fibres and arranged so as to lie flush with a surface of at least one region of the fabric to form an electrical contact area and another portion of said wire or ribbon in electrically conductive material being intercalated between the at least two fabric layers of the insulating fibres, with the electrical contact areas being arranged on the surface of the fabric of electrically insulating fibres of said interconnection device so that contact pads located on back sides of the cells are joined to the contact areas of the interconnection device and so that said contact pads are electrically insulated from one another by a region of the layer of fabric of electrically insulating fibres positioned between said pads.

11. The module of claim 10, wherein the interconnection device ensures the electrical connection of at least one contact pad of a cell with a contact pad of opposite polarity of an adjacent cell via one same electrical contact area or via two separate electrical contact areas, said separate electrical contact areas being electrically connected by a ribbon arranged transverse to said areas.

12. The module of claim 10, further comprising, between the back side of the cells and the interconnection device, at least one layer of a fabric formed of electrically insulating fibres.

13. The module of claim 10, wherein the cells and the interconnection device are encapsulated in an encapsulating material, said material impregnating the fabric of the interconnection device.

14. A process for manufacturing a module comprising a plurality of photovoltaic cells having interconnected back side contacts, comprising:
providing an interconnection device comprising a three-dimensional fabric including at least two fabric layers of electrically insulating fibres joined together by a plurality of electrically insulating fibres, wherein at least one layer of electrically insulating fibres comprises at least one portion of wire or ribbon in electrically conductive material woven with said fibres and arranged so as to lie flush with a surface of at least one region of the fabric to form an electrical contact area intended to be connected to a contact pad located on a back side of a cell, another portion of said wire or ribbon in electrically conductive material being intercalated between the at least two fabric layers of insulating fibres;
matching the contact pads of each of said cells with the electrical contact areas of said device, said contact pads being insulated from one another by a portion of the fabric layer of electrically insulating fibres positioned between said pads;
forming an electrical connection between the pads and said electrical contact areas.

15. The process of claim 14, wherein the electrical connection of the pads with the electrical contact areas is obtained by soldering.

16. The process of claim 14, wherein the electrical connection of the pads with the electrical contact areas is obtained by gluing using a conductive adhesive.

17. The process of claim 14, characterized in that it comprises a lamination step of the device connected to the cells with an encapsulating material, the meshing of the fabric being impregnated by said material.

18. The process of claim 14, further comprising inserting an electrically insulating fabric between the interconnection device and the back side of the photovoltaic cells before forming the electrical connection between the pads and the electrical contact areas, followed by forming said electrical connection by adding an electrically conductive material, said material being able to pass through said fabric.

* * * * *